United States Patent
Suzuki et al.

(10) Patent No.: US 10,665,623 B2
(45) Date of Patent: May 26, 2020

(54) SEMICONDUCTOR DEVICE, SOLID-STATE IMAGE PICKUP ELEMENT, IMAGING DEVICE, AND ELECTRONIC APPARATUS

(71) Applicant: SONY CORPORATION, Tokyo (JP)

(72) Inventors: Rena Suzuki, Kanagawa (JP); Takeshi Matsunuma, Kanagawa (JP); Naoki Jyo, Kanagawa (JP); Yoshihisa Kagawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/551,180

(22) PCT Filed: Feb. 12, 2016

(86) PCT No.: PCT/JP2016/054069
§ 371 (c)(1),
(2) Date: Aug. 15, 2017

(87) PCT Pub. No.: WO2016/136488
PCT Pub. Date: Sep. 1, 2016

(65) Prior Publication Data
US 2018/0033813 A1 Feb. 1, 2018

(30) Foreign Application Priority Data

Feb. 27, 2015 (JP) ................. 2015-038059

(51) Int. Cl.
*H01L 31/0232* (2014.01)
*H01L 27/146* (2006.01)
*H04N 5/374* (2011.01)

(52) U.S. Cl.
CPC .. *H01L 27/14601* (2013.01); *H01L 27/14605* (2013.01); *H01L 27/14623* (2013.01);
(Continued)

(58) Field of Classification Search
None
See application file for complete search history.

(56) References Cited

U.S. PATENT DOCUMENTS 9,318,640 B2 * 4/2016 Hsu ..................... H01L 31/18
2012/0211849 A1 * 8/2012 Matsugai ............ H01L 27/1464
257/432

(Continued)

FOREIGN PATENT DOCUMENTS

CN 102956660 3/2013
CN 103503122 1/2014
(Continued)

OTHER PUBLICATIONS

International Search Report prepared by the Japan Patent Office dated Apr. 19, 2016, for International Application No. PCT/JP2016/054069.

(Continued)

*Primary Examiner* — Ali Naraghi
(74) *Attorney, Agent, or Firm* — Sheridan Ross P.C.

(57) ABSTRACT

The present technology relates to a semiconductor device, a solid-state image pickup element, an imaging device, and an electronic apparatus that can suppress characteristic fluctuations caused by capacitance fluctuations due to a dummy wire, while maintaining an affixing bonding strength by the dummy wire. Two or more chips in which wires that are electrically connected are formed on bonding surfaces and the bonding surfaces opposing each other are bonded to be laminated are included and, with respect to a region where the wires are periodically and repeatedly disposed in sharing units each made up of a plurality of pixels sharing the same floating diffusion contact, a dummy wire is disposed at the
(Continued)

center position thereof on the bonding surface at a pitch of the sharing unit. The present technology can be applied to a CMOS image sensor.

14 Claims, 15 Drawing Sheets

(52) U.S. Cl.
CPC .. *H01L 27/14634* (2013.01); *H01L 27/14641* (2013.01); *H04N 5/374* (2013.01); *H01L 27/14612* (2013.01); *H01L 27/14621* (2013.01); *H01L 27/14627* (2013.01); *H01L 27/14643* (2013.01)

(56) References Cited

U.S. PATENT DOCUMENTS

| | | | |
|---|---|---|---|
| 2013/0049082 A1* | 2/2013 | Kato | ................... H04N 5/3745 257/292 |
| 2014/0145338 A1* | 5/2014 | Fujii | ................. H01L 23/49866 257/762 |
| 2014/0231887 A1* | 8/2014 | Chen | ...................... H01L 31/18 257/291 |
| 2015/0179691 A1 | 6/2015 | Yanagita et al. | |

FOREIGN PATENT DOCUMENTS

| | | |
|---|---|---|
| JP | 2012-253593 A | 12/2012 |
| JP | 2012-256736 A | 12/2012 |
| JP | 2013-9301 A | 1/2013 |
| JP | 2014-22561 A | 2/2014 |
| JP | 2014-110326 A | 6/2014 |
| JP | 2014-165417 A | 9/2014 |

OTHER PUBLICATIONS

Official Action (no English translation available) for Japanese Patent Application No. 2017-502062, dated Dec. 17, 2019, 4 pages.
Official Action (with English translation) for Chinese Patent Application No. 201680010860.0, dated Jan. 20, 2020, 13 pages.

* cited by examiner

FIG. 11

| PITCH | SHAPE | COMBINATION OF UPPER AND LOWER CHIPS | POTENTIAL OF DUMMY WIRE | PRESENCE/ABSENCE OF REAL WIRE |
|---|---|---|---|---|
| FD SHARING UNIT PITCH | SQUARE (LEFT) | UPPER AND LOWER CHIPS BEING SAME IN ALL (INCLUDING SHAPE, SIZE, AND POSITION) | FLOATING | PRESENT |
| COMMON CONTACT PITCH | RECTANGLE (LEFT) | UPPER AND LOWER CHIPS WITH SAME SHAPE AND SIZE BUT DIFFERENT POSITIONS | FIXED POTENTIAL | ABSENT |
| PIXEL PITCH | OCTAGON (LEFT) | UPPER AND LOWER CHIPS WITH SAME SHAPE AND POSITION BUT DIFFERENT SIZES | | |
| | SQUARE (CUT OFF) | UPPER AND LOWER CHIPS WITH DIFFERENT SHAPES | | |
| | RECTANGLE (CUT OFF) | | | |
| | STRIPE: VERTICAL | | | |
| | STRIPE: HORIZONTAL | | | |

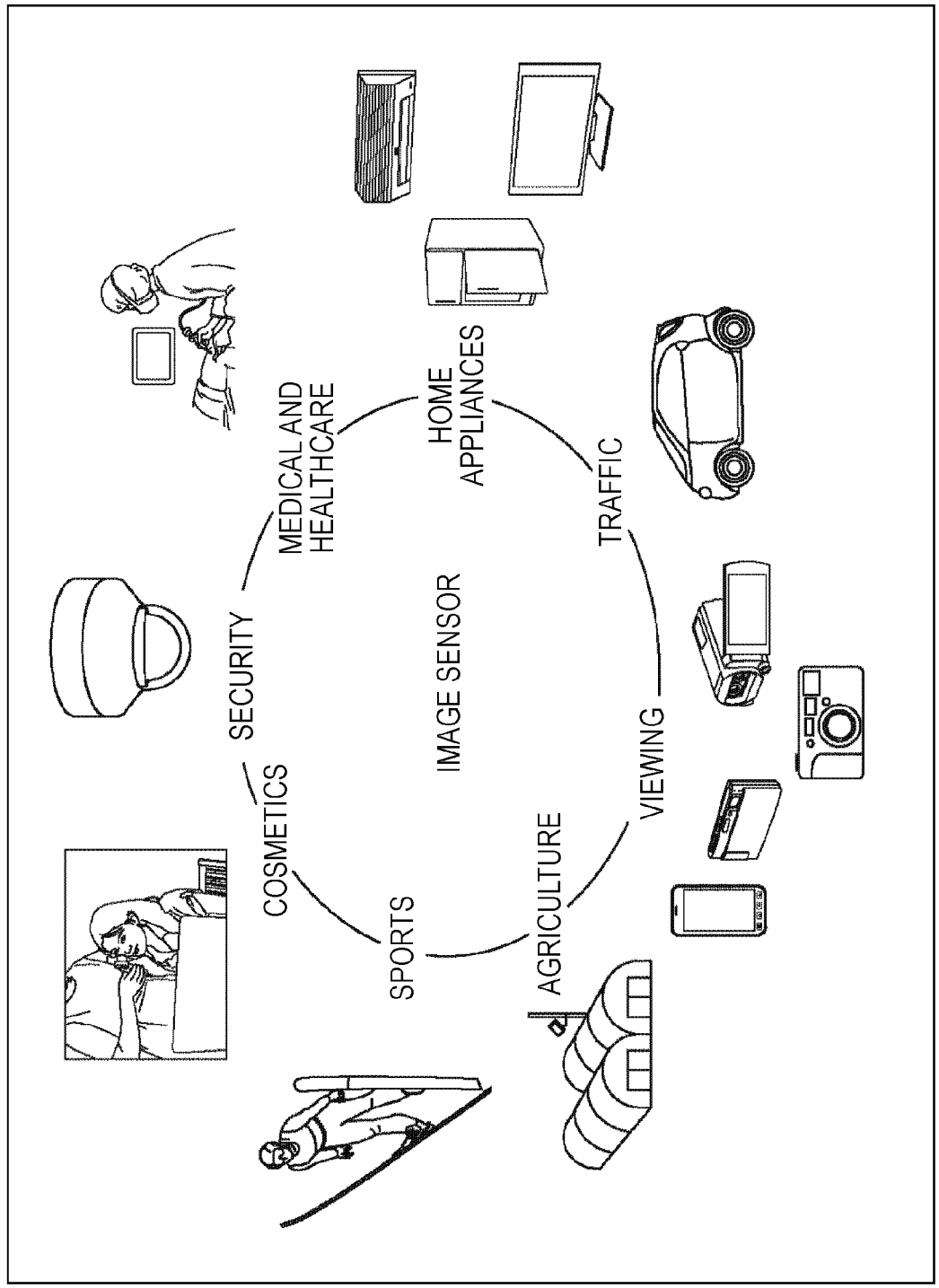

SEMICONDUCTOR DEVICE, SOLID-STATE IMAGE PICKUP ELEMENT, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2016/054069 having an international filing date of 12 Feb. 2016, which designated the United States, which PCT application claimed the benefit of Japanese Patent Application No. 2015-038059 filed 27 Feb. 2015, the disclosures of which are incorporated herein by reference in their entirety.

TECHNICAL FIELD

The present technology relates to a semiconductor device, a solid-state image pickup element, an imaging device, and an electronic apparatus, and more particularly to a semiconductor device, a solid-state image pickup element, an imaging device, and an electronic apparatus which can suppress characteristic fluctuations caused by capacitance fluctuations due to a dummy wire, while maintaining an affixing bonding strength by the dummy wire, for a device configured by affixing a plurality of chips together to laminate.

BACKGROUND ART

As a technology for manufacturing a laminated semiconductor device by bonding two or more semiconductor chips, a wiring layer is formed on a bonding surface between both chips and the chips are affixed together at the wiring layer on the bonding surface so as to be electrically connected.

In the case of a solid-state image pickup element, a configuration is adopted in which, by affixing a wafer having a photoelectric conversion unit formed thereon and a wafer including a circuit configured to perform signal processing, via an electrical connection unit, a signal is transmitted to a signal processing circuit from the photoelectric conversion unit via a wiring unit on an affixed surface.

As such a technology for the solid-state image pickup element, there is proposed a technology in which a true connection wiring unit electrically connected to a portion where a photoelectric conversion unit is formed and a dummy wire not electrically connected a portion other than the portion where the photoelectric conversion unit is formed are formed on an affixed surface and the true connection wiring unit and the dummy wire are arranged at the same interval, such that yield at the time of manufacture is improved (refer to Patent Document 1).

CITATION LIST

Patent Document

Patent Document 1: Japanese Patent Application Laid-Open No. 2013-168623

SUMMARY OF THE INVENTION

Problems to be Solved by the Invention

Incidentally, in the case of affixing wiring layers, there is a need to keep the coverage of metal on a bonding surface within a predetermined range in order to maintain the flatness of the bonding surface and the affixing strength thereof. It has been therefore proposed to arrange a dummy wire on the bonding surface in order to keep the coverage of the metal within a predetermined range.

However, in the case of a solid-state image pickup element, a phenomenon that the dummy wire located within a pixel is reflected in an output image sometimes occurs. This phenomenon is assumed to be caused by fluctuations of the parasitic capacitance of each pixel arising due to the coupling between the dummy wires depending on the arrangement of the dummy wires.

As long as a device is constituted by chips laminated on each other, characteristic fluctuations caused by capacitance fluctuations arise due to the coupling of the dummy wires even for devices other than the solid-state image pickup element. For example, a case where a flash memory or the like is formed in a laminated structure, there is a possibility that the characteristic varies from one cell to another due to the dummy wire and it becomes difficult to perform an appropriate action.

The present technology has been made in view of such a situation and, in particular, it is an object of the present technology to enable the suppression of characteristic fluctuations caused by capacitance fluctuations due to a dummy wire, while an affixing bonding strength of chips is maintained by the dummy wire, for a device configured by affixing a plurality of chips together to laminate.

Solutions to Problems

A semiconductor device according to an aspect of the present technology includes two or more chips in which wires that are electrically connected are formed on bonding surfaces and the bonding surfaces opposing each other are bonded to be laminated, and in the semiconductor device, with respect to a region where the wires are periodically and repeatedly disposed in predetermined units, a dummy wire is disposed on the bonding surface at a pitch corresponding to the predetermined unit.

The semiconductor device can be a solid-state image pickup element, in which, with respect to a region where the wires are periodically and repeatedly disposed in predetermined units for a pixel of the solid-state image pickup element, the dummy wire is disposed on the bonding surface at a pitch corresponding to the predetermined unit.

It is possible to make the dummy wire disposed on one of the bonding surfaces opposing each other and the dummy wire disposed on another of the bonding surfaces opposing each other have substantially the same pattern.

It is possible to make the dummy wire disposed on one of the bonding surfaces opposing each other and the dummy wire disposed on another of the bonding surface opposing each other have different patterns.

The predetermined unit for the pixel of the solid-state image pickup element can be a plurality of the pixels sharing a contact of the same floating diffusion.

The predetermined unit for the pixel of the solid-state image pickup element can be a plurality of the pixels sharing the same floating diffusion.

The predetermined unit for the pixel of the solid-state image pickup element can be a single one of the pixels.

With respect to a region where the wires are periodically and repeatedly disposed in the predetermined units for the pixel of the solid-state image pickup element, a real wire can be disposed along with the dummy wire on the bonding surface at a pitch corresponding to the predetermined unit.

An electrode to which a predetermined voltage is applied can be included, and the dummy wire can be fixed to the predetermined voltage applied from the electrode.

A solid-state image pickup element according to an aspect of the present technology includes two or more chips in which wires that are electrically connected are formed on bonding surfaces and the bonding surfaces opposing each other are bonded to be laminated, and in the solid-state image pickup element, with respect to a region where the wires are periodically and repeatedly disposed in predetermined units for a pixel, the dummy wire is disposed on the bonding surface at a pitch corresponding to the predetermined unit.

An imaging device according to an aspect of the present technology includes two or more chips in which wires that are electrically connected are formed on bonding surfaces and the bonding surfaces opposing each other are bonded to be laminated, and in the imaging device, with respect to a region where the wires are periodically and repeatedly disposed in predetermined units for a pixel, the dummy wire is disposed on the bonding surface at a pitch corresponding to the predetermined unit.

An electronic apparatus according to an aspect of the present technology includes two or more chips in which wires that are electrically connected are formed on bonding surfaces and the bonding surfaces opposing each other are bonded to be laminated, and in the electronic apparatus, with respect to a region where the wires are periodically and repeatedly disposed in predetermined units for a pixel, the dummy wire is disposed on the bonding surface at a pitch corresponding to the predetermined unit.

In an aspect of the present technology, two or more chips in which wires that are electrically connected are formed on bonding surfaces and the bonding surfaces opposing each other are bonded to be laminated are included, and with respect to a region where the wires are periodically and repeatedly disposed in predetermined units for a pixel, the dummy wire is disposed on the bonding surface at a pitch corresponding to the predetermined unit.

Effects of the Invention

According to an aspect of the present technology, characteristic fluctuations caused by capacitance fluctuations due to a dummy wire can be suppressed, while an affixing bonding strength of chips is maintained by the dummy wire, for a device configured by affixing a plurality of chips together to laminate.

BRIEF DESCRIPTION OF DRAWINGS

FIG. 11 is a diagram for explaining points of the solid-state image pickup element to which the present technology is applied.

FIG. 15 is a diagram illustrating an example of use of the solid-state image pickup element.

MODE FOR CARRYING OUT THE INVENTION

Examples of best modes for carrying out the present invention will be described hereinafter but the present invention is not limited to the following examples.

First Embodiment

<Circuit Configuration Example of Solid-State Image Pickup Element>

Figure 1:
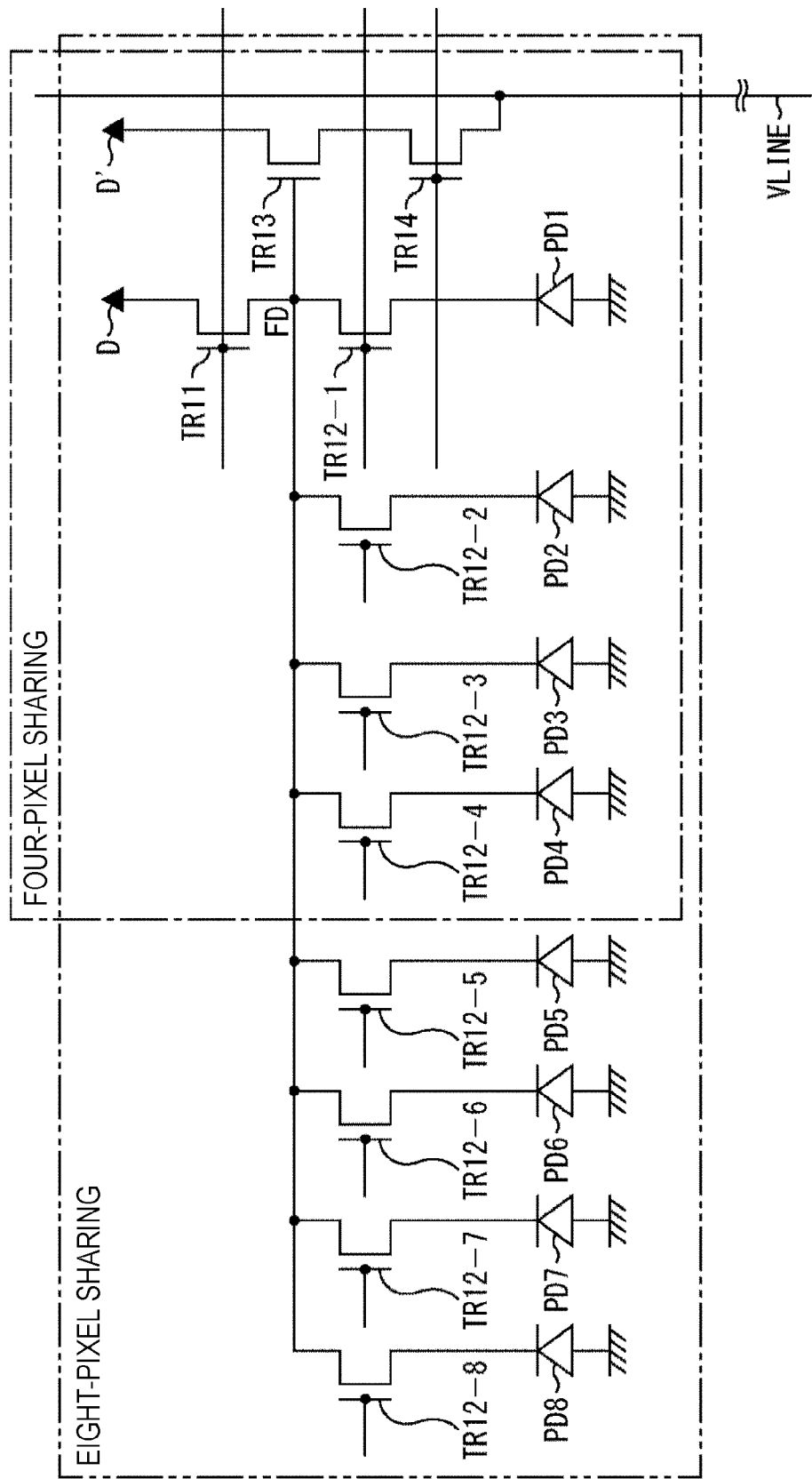
FIG. 1 is a diagram for explaining a circuit configuration example of a solid-state image pickup element to which the present technology is applied.

Next, referring to FIG. 1, a circuit configuration example of a solid-state image pickup element to which the present technology is applied will be described. FIG. 1 illustrates an example of a circuit configuration constituting the solid-state image pickup element to which the present technology is applied.

The circuit configuration example of the solid-state image pickup element in FIG. 1 includes a reset transistor TR11, transfer transistors TR12-1 to TR12-8, an amplification transistor TR13, a selection transistor TR14, a floating diffusion FD (hereinafter also simply referred to as FD), photodiodes PD1 to PD8 (hereinafter also simply referred to as PD1 to PD8), and a vertical transfer line VLINE.

The solid-state image pickup element in FIG. 1 is a solid-state image pickup element including a total of four types of transistors, namely, the reset transistor TR11, the transfer transistors TR12-1 to TR12-8, the amplification transistor TR13, and the selection transistor 14 and thus categorized particularly as a solid-state image pickup element called a 4TR type (4-transistor type). Note that, in the present working example, explanation will be made by taking the 4TR type solid-state image pickup element as an example, but other configurations may be adopted. For example, a 3TR type solid-state image pickup element constituted by the three types of transistors except the selection transistor TR14 may be employed.

The PD1 to the PD8 generate charges corresponding to the amount of incident light through photoelectric conversion and accumulate the generated charges.

The transfer transistors TR12-1 to TR12-8 are transistors that open and close according to a transfer signal and are turned on in a case where the transfer signal is at a high level to transfer the charges accumulated in the PD1 to the PD8 to the FD.

The FD accumulates the charges transferred from the PD1 to the PD8 via the transfer transistors TR12-1 to TR12-8, according to open/closed states of the reset transistor TR11 and the amplification transistor TR13.

The reset transistor TR11 is a transistor that opens and closes according to a reset signal and is turned on in a case where the reset signal is at a high level to discharge the charges accumulated in the FD to a drain D.

The amplification transistor TR13 is a transistor controlled by an input voltage corresponding to the charges accumulated in the FD and amplifies the voltage applied from a drain D' with the input voltage corresponding to the charges accumulated in the FD to output to the selection transistor TR14 as a pixel signal.

The selection transistor TR14 is a transistor that is opened and closed according to a selection control signal and controlled to be turned on when the selection control signal is at the high level and outputs the pixel signal output from the amplification transistor TR13 to the vertical transfer line VLINE.

That is, by turning on the reset transistor TR11 and the transfer transistors TR12-1 to TR12-8, the PD1 to the PD8 and the FD are reset.

Next, when the reset transistor TR11 and the transfer transistors TR12-1 to TR12-8 are turned off, exposure states of the PD1 to the PD8 are reached and a charge corresponding to the amount of incident light is generated through photoelectric conversion sequentially in the PD1 to the PD8 to be accumulated.

Here, when one of the transfer transistors TR12-1 to TR12-8 is turned on, the charges accumulated in corresponding one of the PD1 to the PD8 are transferred to the FD.

At this time, a voltage corresponding to the charges accumulated in one of the PD1 to the PD8 and transferred to the FD is input to a gate of the amplification transistor TR13 such that the amplification transistor TR13 amplifies a voltage applied by a drain terminal D' to output to the selection transistor TR14 as the pixel signal.

Subsequently, when the selection transistor TR14 is turned on by a selection signal, the pixel signal output from the amplification transistor TR13 is output to the vertical transfer line VLINE.

Thereafter, the PD1 to the PD8 are sequentially switched such that the pixel signals equivalent to eight pixels are sequentially switched to be output.

Here, FIG. 1 illustrates a circuit configuration example in which the transfer transistors TR12-1 to 12-8 are provided for the same FD so as to connect cathodes of the PD1 to the PD8 between sources and drains.

That is, FIG. 1 illustrates a circuit configuration when eight pixels of the PD1 to the PD8 are shared by one FD.

With such a configuration, for example, while the transfer transistors TR12-2 to TR12-8 are kept in an off state, the FD can be used for one pixel of the PD1 by controlling the transfer transistor TR12-1 to be turned on or off. Similarly, by sequentially switching turning on and off of the transfer transistors TR12-2 to TR12-8, the FD can be used by being switched for each of the PD1 to the PD8. As a result, eight-pixel sharing in which one FD (including the reset transistor TR11, the amplification transistor TR13, the selection transistor TR14, and the vertical transfer line VLINE) is shared by eight pixels, which is surrounded by a two-dot chain line in FIG. 1, is realized.

Additionally, for example, as indicated by a range surrounded by a one-dot chain line in FIG. 1, four-pixel sharing in which one FD is shared by four pixels is realized with a configuration only including the transfer transistors TR12-1 to 12-4 and the PD1 to the PD4 in addition to one reset transistor TR11, one amplification transistor TR13, one selection transistor TR14, and one vertical transfer line VLINE.

Furthermore, other number of PDs can be realized as well by connecting the PDs to a common FD via the transfer transistor.

Note that, in the following description, a group of a plurality of pixels using one FD by sharing as described above will be referred to as a sharing unit. Therefore, in FIG. 1, the range surrounded by the one-dot chain line is a sharing unit for realizing the four-pixel sharing, while the range surrounded by the two-dot chain line is a sharing unit for realizing the eight-pixel sharing.

<Layout of Solid-State Image Pickup Element>

Figure 2:
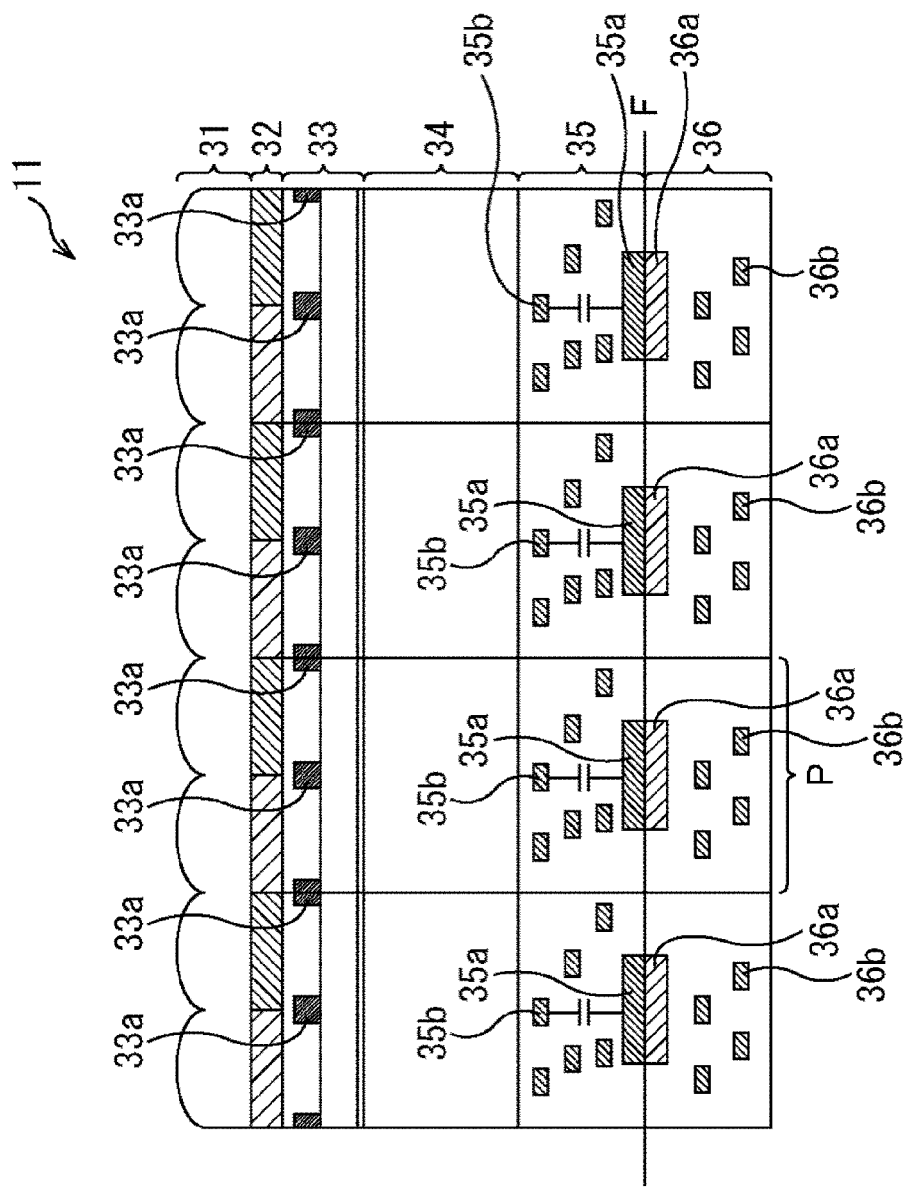
FIG. 2 is a view for explaining a side cross section of a configuration example according to a first embodiment of the solid-state image pickup element to which the present technology is applied.
Figure 3:
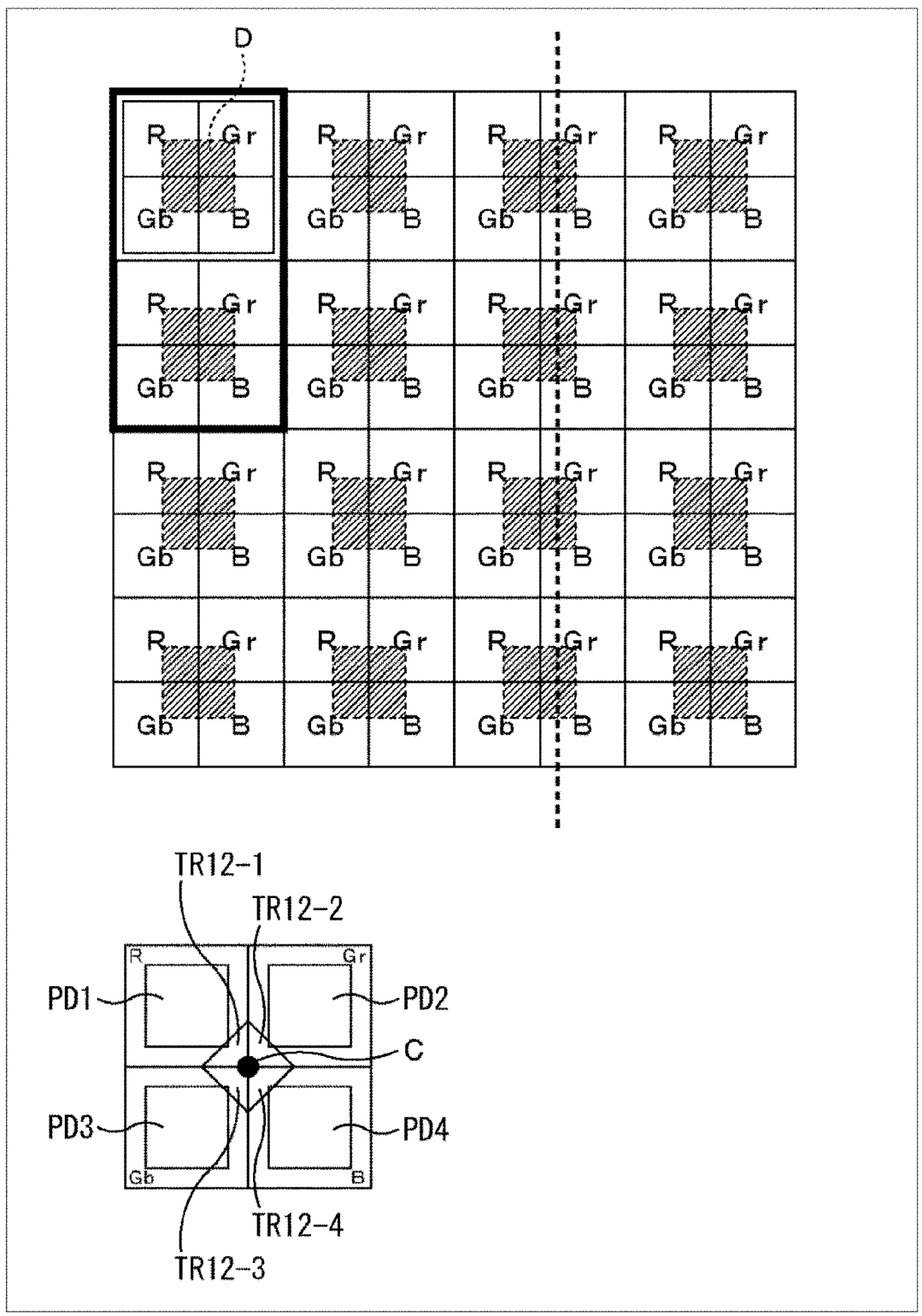
FIG. 3 is a diagram for explaining a disposition pattern of dummy wires of the solid-state image pickup element in FIG. 2.

FIGS. 2 and 3 are diagrams for explaining a layout of the solid-state image pickup element to which the present technology is applied. FIG. 2 is a side cross-sectional view, whereas FIG. 3 is a top view. In more detail, the cross-sectional view in FIG. 2 illustrates a side cross section of a portion indicated by a dotted line in FIG. 3.

The solid-state image pickup element 11 in FIG. 2 is constituted by a lens layer 31, a color filter layer 32, a light shielding wall layer 33, a photoelectric conversion layer 34, and wiring layers 35 and 36 from above.

The lens layer 31 transmits incident light, which is light incident from the upper side in FIG. 2, such that the incident light condenses in the photoelectric conversion layer 34 so as to be focused.

The color filter layer 32 transmits only light of a specific wavelength among the incident light having passed through the lens image 31 in pixel units. In more detail, for example, the color filter layer 32 extracts light having wavelengths corresponding to light of colors such as R, G (Gr and Gb), and B (red, green, and blue) as illustrated in FIG. 3, in pixel units to transmit.

The light shielding wall layer 33 is a layer on which a light shielding wall 33a is provided and this light shielding wall 33a shields incident light from adjacent pixels such that light in pixel units formed for each convex portion in the lens layer 31 in FIG. 1 is only incident on a PD in the photoelectric conversion layer 34 corresponding to a pixel immediately below each convex portion.

The photoelectric conversion layer 34 is a layer on which the above-described PD1 to PD8 serving as the pixel units are formed and generates a charge corresponding to the amount of incident light through photoelectric conversion to transfer the generated charge to the FD via the transfer transistor TR12 provided in the wiring layer.

The wiring layer 35 is provided with the reset transistor TR11, the transfer transistor TR12, the amplification transistor TR13, the selection transistor TR14, the FD, and the drains D and D' and outputs the pixel signal to a real wire (a wire through which a signal is actually transmitted) (not illustrated) of the wiring layer 36 via a real wire (not illustrated). Meanwhile, dummy wires 35a and 35b made of copper (Cu) are provided within the wiring layer 35 in FIG. 2 at the same pitch as an FD contact to reinforce the strength generated from the bonding of the wiring layers 35 and 36.

The wiring layer 36 is provided with a circuit for processing the pixel signal input from the real wire (not illustrated) of the wiring layer 36 via the real wire (not illustrated) of the wiring layer 35. In addition, as in the case of the wiring layer 35, the wiring layer 36 also has dummy wires 36a and 36b provided at the same pitch as the FD contact.

The wiring layers 35 and 36 are formed in a state where the wiring layers 35 and 36 are affixed together and electrically connected to each other with a bonding surface F as a boundary via the real wires (not illustrated) and the respective wiring layers 35 and 36 are formed as separate chips (wafers) in an initial stage of manufacturing. Additionally, while the dummy wires 35a and 36a are affixed together at the bonding surface F, the dummy wires 35b and 36b are representative of all dummy wires other than the dummy wires 35a and 36a. Therefore, in the wiring layers 35 and 36 in FIG. 2, quadrangular-shaped structures not labeled are all included in the dummy wires 35b and 36b.

In the solid-state image pickup element 11 illustrated in FIGS. 2 and 3, a total of eight pixels of two pixels×four pixels are set as a sharing unit. In more detail, the sharing unit is set with eight pixels in such a manner that four-pixel unit portions each made up of an R pixel, a Gr pixel, a Gb pixel, and a B pixel illustrated within a heavy line at the upper left in FIG. 3 are disposed above and below each other. In addition, in the example in FIG. 3, the FD contacts (not illustrated) are provided so as to be electrically connected to the FDs at the respective central positions of upper two pixels×two pixels and lower two pixels×two pixels within the sharing unit made up of the above-mentioned eight pixels.

Since the dummy wires 35a and 36a are arranged at the same pitch as this FD contact, a pixel unit indicated by the convex portion in the lens layer 31 in the cross section in FIG. 2 is set in units of two pixels indicated by P.

As illustrated in the lower part of FIG. 3, the FD contact is an FD contact C electrically connected to the FD provided on an output side of the transfer transistors TR12-1 to TR12-4 which transfer corresponding charges when respective pixels of two pixels×two pixels are constituted by the PD1 to the PD4. As illustrated in the lower part of FIG. 3, the FD contact C is provided at the center position with respect to the layout of two pixels×two pixels. Accordingly, in the example in the upper part of FIG. 3, the pitch of two pixels×two pixels with respect to a horizontal direction×a vertical direction is defined as an FD contact pitch.

Therefore, the upper part of FIG. 3 illustrates that the dummy wires 35a and 36a corresponding to a dummy wire D are arranged in the wiring layers 35 and 36 in a quadrangular shape at a similar pit as the FD contact pitch of two pixels×two pixels.

Similarly, the dummy wires 35a and 35b and the dummy wires 36a and 36b are all arranged at equal intervals by the pitch of the FD contacts. In other words, a pitch at which the dummy wires 35a and the dummy wires 36b are both arranged is the same as a pitch at which the FD contact C is arranged.

By disposing the dummy wire D as illustrated in FIG. 3, the parasitic capacitance arising due to the coupling between the dummy wires 35a and 36a can be made the same in each pixel. Note that, needless to say, the same applies to a parasitic capacitance arising due to the coupling between other dummy wires.

As a result, characteristic fluctuations caused by capacitance fluctuations due to the dummy wire can be suppressed, while an affixing bonding strength of wafers is maintained by that dummy wire, for a device configured by affixing a plurality of chips together to laminate.

In addition, in FIG. 2, although a symbol of a capacitor is given in the wiring layer 35 such that the dummy wire 35a and the dummy wire 35b serves as end portions, this is not intended to indicate the presence of a capacitor as a practical case but schematically represents the parasitic capacitance arising due to the coupling between the dummy wire 35a and the dummy wire 36b.

Second Embodiment

The above description has used an example in which the dummy wire is disposed at a pitch similar to the pitch of the FD contact. By disposing the dummy wire at the pitch of the FD contact, practically, the parasitic capacitance arising due to coupling is made the same in each pixel. Therefore, the dummy wire can achieve a similar effect even with a dummy wire at the pitch of the FD contact but in another shape in each pixel.

Figure 4:
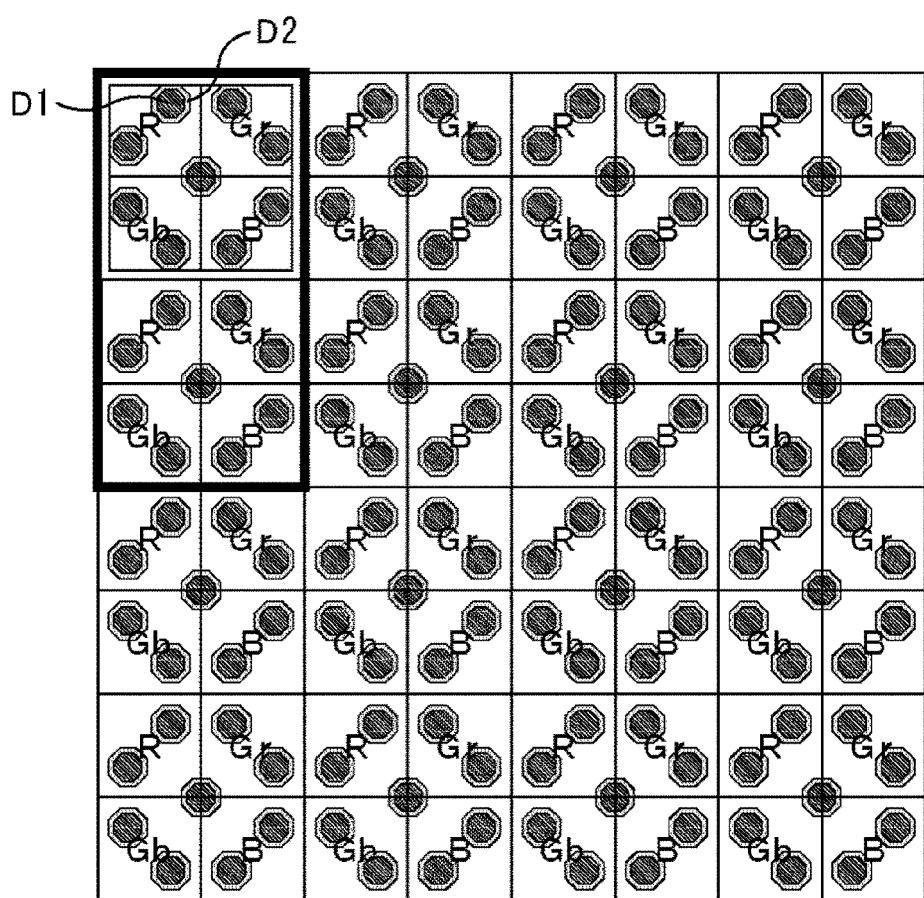
FIG. 4 is a diagram for explaining a configuration example according to a second embodiment of the solid-state image pickup element to which the present technology is applied.

FIG. 4 illustrates a configuration example of the solid-state image pickup element in which, in two pixels×two pixels where the FD contact is formed at the center thereof, the dummy wire D is disposed so as to be point-symmetrical with respect to the horizontal direction and the vertical direction using a position where the FD contact is arranged as the center.

In more detail, as illustrated in FIG. 4, dummy wires D1 and D2 having octagonal shapes are provided at a central portion where the FD contact for two pixels×two pixels is arranged and at respective positions serving as the vertexes of an octagon concentric with that central portion.

The dummy wire D1 in FIG. 4 corresponds to the dummy wire 35a in FIG. 2, whereas the dummy wire D2 corresponds to the dummy wire 36a in FIG. 2.

Each of the dummy wires D1 and D2 has an octagonal shape and the dummy wire D2 has an octagonal shape with a diameter somewhat larger than that of the dummy wire D1. In addition, a total of nine dummy wires D1 and D2 are disposed in the range of two pixels×two pixels where the FD contact is disposed at the center position, in such a manner that one wire is disposed at the center position, which is the position where the FD contact is disposed, and eight wires are disposed at the positions of eight vertexes when an octagon is formed concentrically with respect to the center position.

By disposing the dummy wires D1 and D2 in this manner, the dummy wires D1 and D2 are disposed point-symmetrically within the multiple pixels of two pixels×two pixels where the FD contact is disposed at the center position. As a result, characteristic fluctuations caused by the parasitic capacitance due to the coupling between the dummy wires D1 and D2 can be made the same in every pixel.

Note that the shape and the number of the dummy wires are not limited as long as the dummy wires D1 and D2 are arranged at the pitch of the FD contact and disposed point-symmetrically using the FD contact as the center within two pixels×two pixels in which a position where the FD contact is disposed is used as the center and this FD contact is shared thereamong. In addition, the dummy wire D1 corresponding to the dummy wire 35a on an upper chip side and the dummy wire D2 corresponding to the dummy wire 36a on a lower chip side may have the same size as each other or different sizes from each other. It is possible to suppress characteristic fluctuations caused by capacitance fluctuations due to the dummy wire, while an affixing bonding strength of wafers is maintained, for a device configured by affixing a plurality of chips together to laminate.

Third Embodiment

The above description has used an example in which, by repeatedly disposing the dummy wires D (or D1 and D2) at the same positions as those of the FD contacts at the pitch thereof, characteristic fluctuations caused by capacitance fluctuations arising due to the coupling between the disposed dummy wires are suppressed. However, as long as the capacitance fluctuations arising due to the coupling between the dummy wires are the same, characteristic fluctuations can be suppressed even if the dummy wires are disposed by another method. For example, as illustrated in FIG. 5, the dummy wire D may be disposed in a shape that matches in the sharing units by the FD such that a fixed potential is applied to the dummy wire D.

Figure 5:
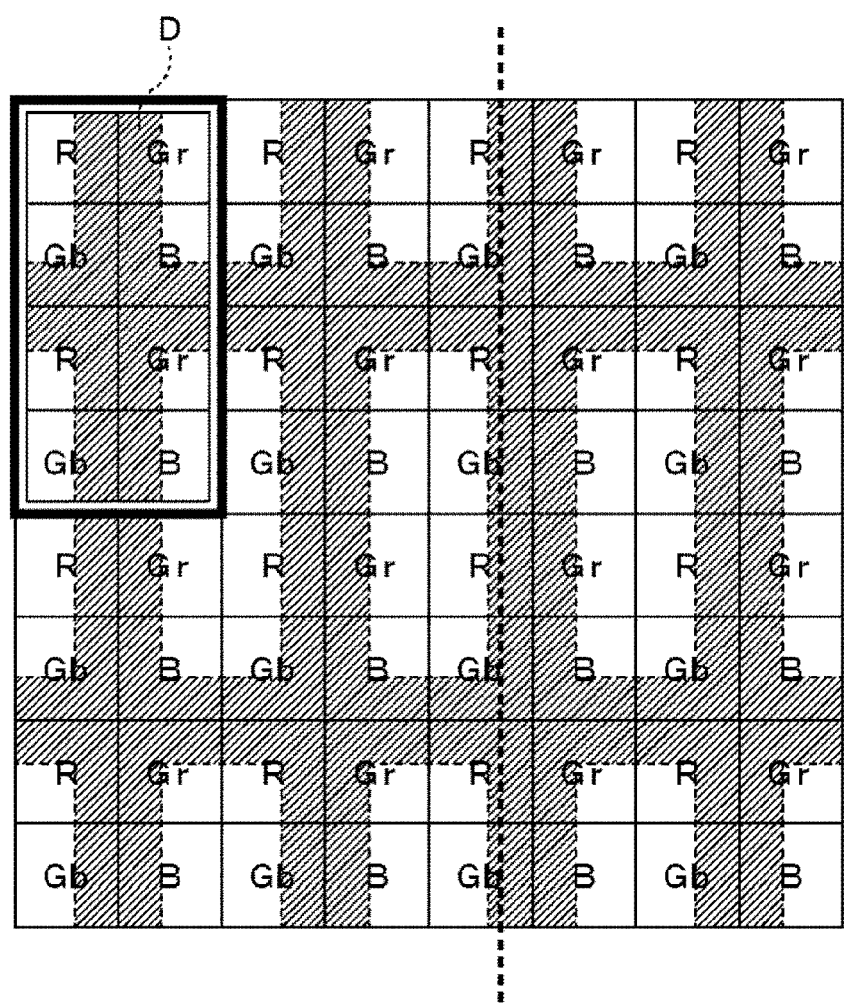
FIG. 5 is a diagram for explaining a configuration example according to a third embodiment of the solid-state image pickup element to which the present technology is applied.

That is, in the solid-state image pickup element in FIG. 5, the dummy wire D is disposed in a band shape in the vertical direction in the vicinity of the center of a sharing unit of two pixels×four pixels in the horizontal direction, while being disposed in a band shape in the horizontal direction in the vicinity of the center of a sharing unit of two pixels×four pixels in the vertical direction, whereby the dummy wires D are disposed in a lattice pattern.

Figure 6:
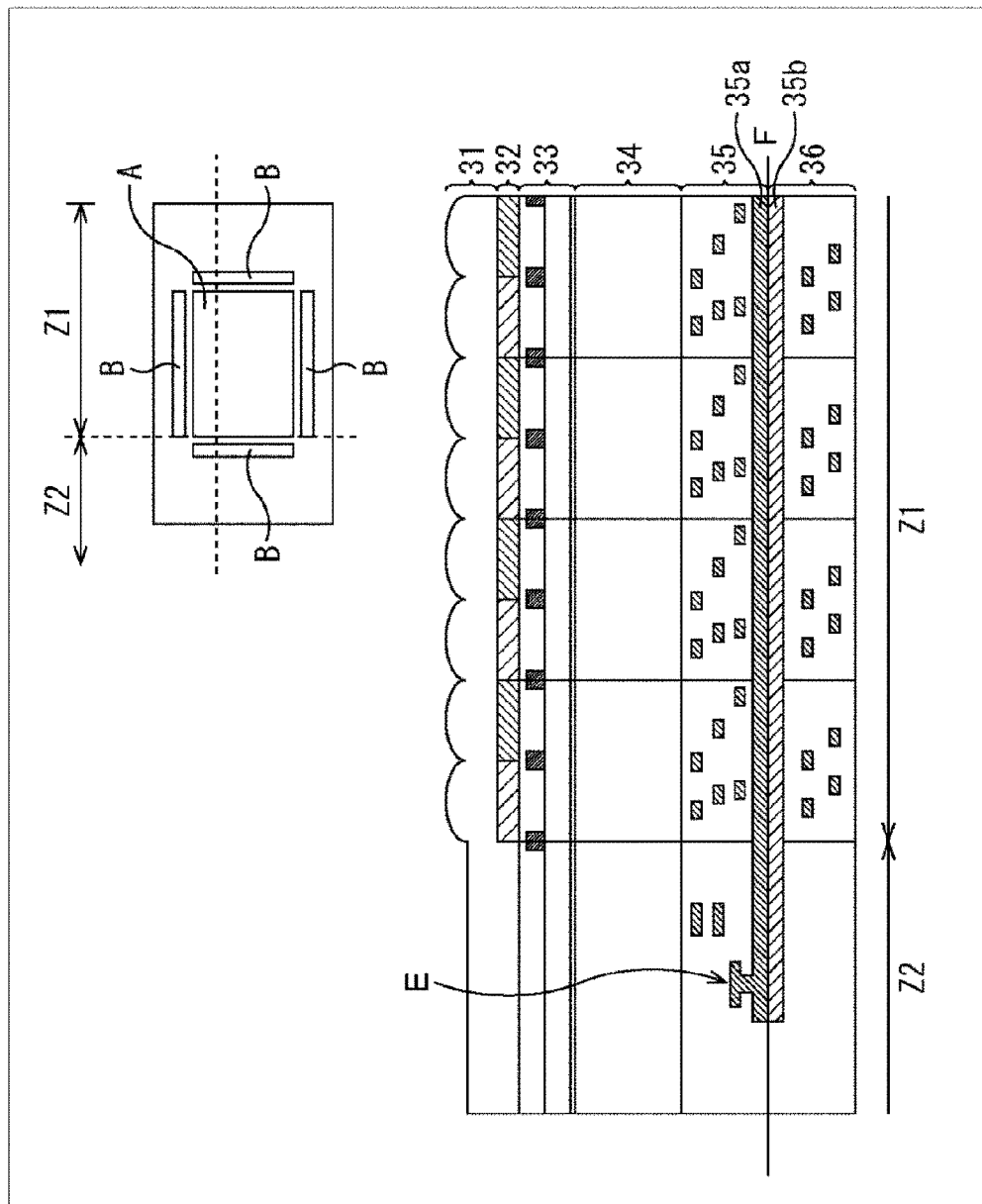
FIG. 6 is a view for explaining a side cross section of a configuration example of the solid-state image pickup element in FIG. 5.

The upper part of FIG. 6 is a top view of a chip constituting the solid-state image pickup element in FIG. 5, whereas the lower part of FIG. 6 is a side cross section of a dotted line portion in FIG. 5. As illustrated in the upper part of FIG. 6, a central range of the chip is an effective region A of the solid-state image pickup element and electrodes B are provided around this range. In addition, as illustrated in the side cross section of the dotted line portion of FIG. 5 in the lower part of FIG. 6, the dummy wires 35a and 36a are formed so as to be continuously connected in the horizontal direction in FIG. 6.

As illustrated in the lower part of FIG. 6, a right side portion Z1 where the lens layer 31 is formed is a portion corresponding to the effective region A, whereas a left side portion Z2 in FIG. 6 where the lens layer 31 is formed is a region other than the effective region A (non-effective region). That is, the portion Z1 in the lower part of FIG. 6 corresponds to the effective region A in the upper part of FIG. 6. In the lower part of FIG. 6, a power supply contact E is provided in a range belonging to the portion Z2 on the dummy wire 35a and the power supply contact E is connected to the electrode B in the upper part of FIG. 6. With such a configuration, the potentials of the dummy wires 35a and 36a are set to a fixed potential.

That is, by disposing the dummy wires D in a lattice pattern in a planar direction as illustrated by the dummy wires D in FIG. 5 and also using a laminated configuration as illustrated by the dummy wires 35a and 36a (=the dummy wire D) in FIG. 6, the dummy wire D (35a and 36a) is set to a fixed potential. With such a configuration, characteristic fluctuations caused by capacitance fluctuations corresponding to the parasitic capacitance arising due to the coupling of the dummy wires can be made the same in sharing units each made up of two pixels×four pixels.

As a result, it is possible to suppress characteristic fluctuations caused by capacitance fluctuations due to the dummy wire, while an affixing bonding strength of wafers is maintained, for a device configured by affixing a plurality of chips together to laminate. Note that the power supply contact E may be provided at either of the portion Z1 which is the effective region A and the portion Z2 which is the non-effective region and may be connected to either of the dummy wires 35a and 36a. Alternatively, a configuration in which the connection by the power supply contact E is not provided and the potential is not fixed may be adopted. In addition, the dummy wire D may have not only a lattice pattern as illustrated in FIG. 5 but also a configuration with only stripes in the horizontal direction or only stripes in the vertical direction. Furthermore, the dummy wire is not limited to being disposed in such a manner that the dummy wires are provided on the entire surface and rectangular shapes are removed therefrom as in the lattice pattern in FIG. 5, but may be disposed by cropping out another shape. For example, a lattice pattern obtained by cropping out square shapes from the dummy wires provided on the entire surface may be adopted.

Fourth Embodiment

The above description has used an example in which the dummy wires 35a and 36a in the wiring layers 35 and 36 all have substantially the same shape and are arranged at substantially the same position, but the dummy wires 35a and 36a may be disposed in different shapes and at different positions as long as the dummy wires 35a and 36a are individually arranged at the pitch of the FD contact.

Figure 7:
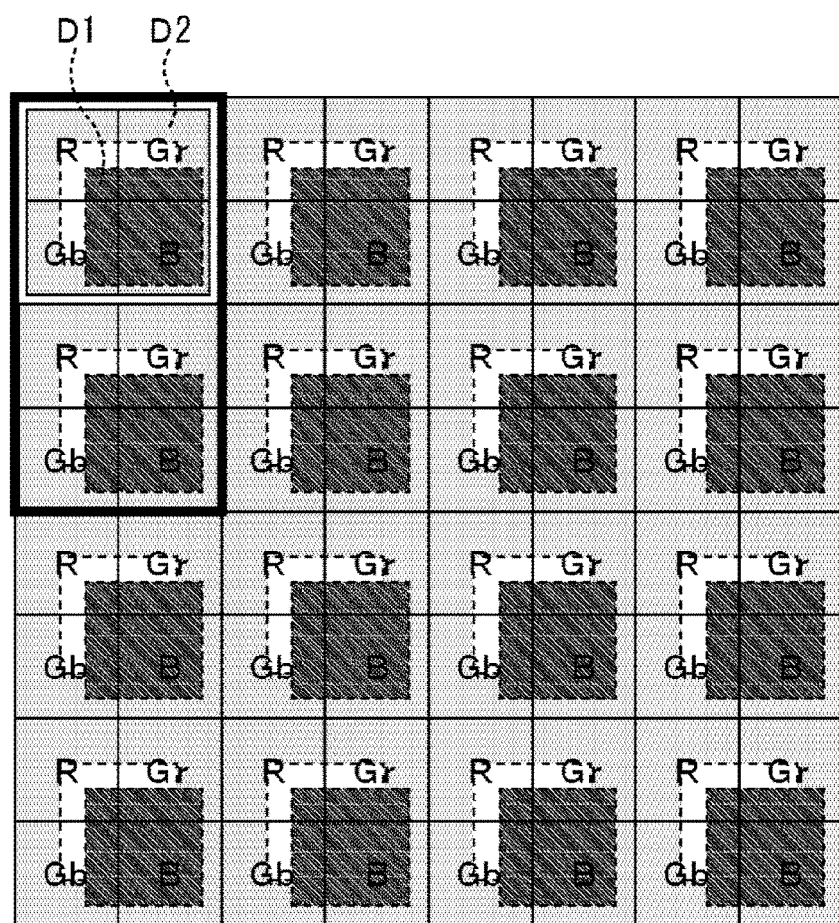
FIG. 7 is a diagram for explaining a configuration example according to a fourth embodiment of the solid-state image pickup element to which the present technology is applied.

FIG. 7 illustrates a configuration example of the solid-state image pickup element in which the dummy wires 35a and 36a are disposed in different shapes and at different positions.

More specifically, in FIG. 7, each of the dummy wires D1 corresponding to the dummy wires 35a is disposed in a square shape at a position shifted from the center position of the range of two pixels×two pixels sharing the same FD contact by the same distance in the same direction. Meanwhile, the dummy wire D2 corresponding to the dummy wire 36a is disposed such that a square is cut out from the range of two pixels×two pixels having a common FD contact.

As described above, the dummy wire D1 corresponding to the dummy wire 35a of an upper side chip and the dummy wire 36a corresponding to the dummy wire 36a of a lower side chip may have different shapes and positions on the bonding surface F. However, in this case, as long as the dummy wires D1 and D2 are individually disposed in the same shape and at the same position within the range of two pixels×two pixels sharing the FD contact, it is possible to suppress characteristic fluctuations caused by capacitance fluctuations due to the dummy wire, while an affixing bonding strength of wafers is maintained, for a device configured by affixing a plurality of chips together to laminate. Incidentally, as described above, the potentials of the dummy wires D1 and D2 may be fixed.

Fifth Embodiment

The above description has used an example in which the dummy wires D1 and D2 corresponding to the dummy wires 35a and 36a in the wiring layers 35 and 36 are constituted by a sharing unit of two pixels×two pixels sharing the same FD contact or a sharing unit of two pixels×four pixels sharing the FD at the same position. However, the dummy wires D1 and D2 may have the same shape and position in a smaller unit within the sharing unit by the FD.

Figure 8:
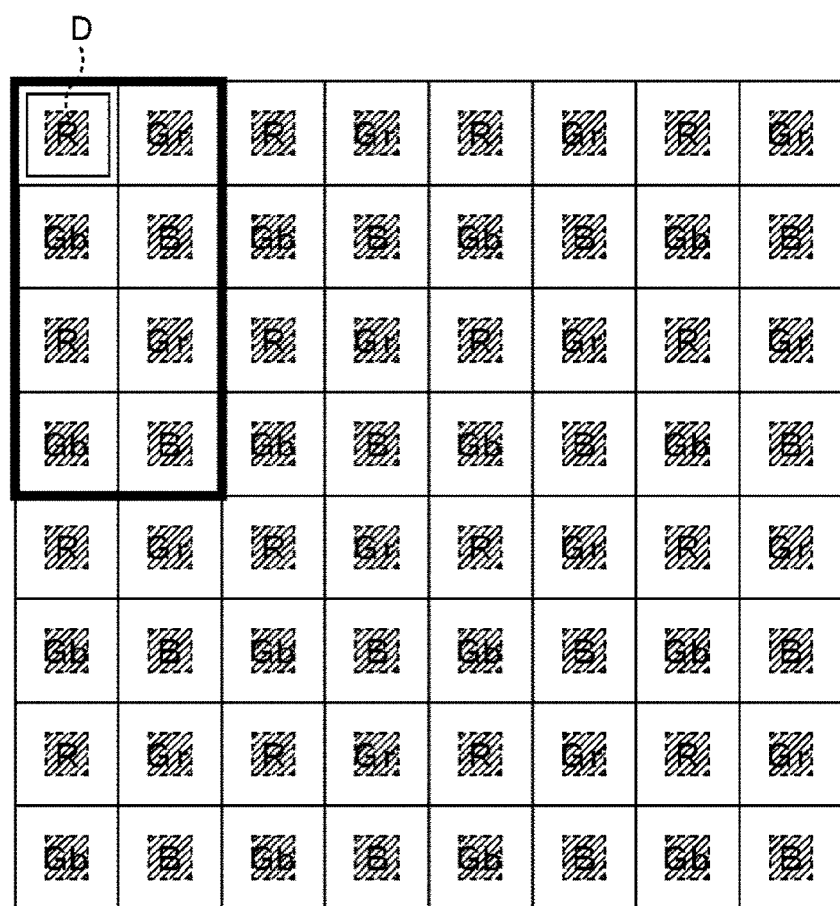
FIG. 8 is a diagram for explaining a configuration example according to a fifth embodiment of the solid-state image pickup element to which the present technology is applied.

The solid-state image pickup element in FIG. 8 illustrates a configuration example of the solid-state image pickup element when the dummy wires D corresponding to the dummy wires 35a and 36a are provided at the same position and in the same shape in pixel units.

In more detail, the solid-state image pickup element in FIG. 8 illustrates a configuration example of the solid-state image pickup element in which the dummy wire D which is the dummy wires 35a and 36a having a quadrangular shape is provided in the vicinity of the center of each pixel constituting the sharing unit.

Even with such a configuration, as a result, the dummy wires D corresponding to the dummy wires 35a and 36a are disposed in the same shape and at the same position in units of two pixels×two pixels sharing the same FD contact. This makes it possible to suppress characteristic fluctuations cause by capacitance fluctuations due to the dummy wire, while an affixing bonding strength of wafers is maintained, for a device configured by affixing a plurality of chips together to laminate.

Sixth Embodiment

The above description has used an example in which the disposition positions of the dummy wires 35a and 36a in the wiring layers 35 and 36 are configured using the same shape and position at a pitch for sharing the same FD contact but additionally, the arrangement of the real wire that actually transmits the pixel signal from the wiring layer 35 to the wiring layer 36 may be also the same arrangement in units of two pixels×two pixels sharing the same FD contact.

Figure 9:
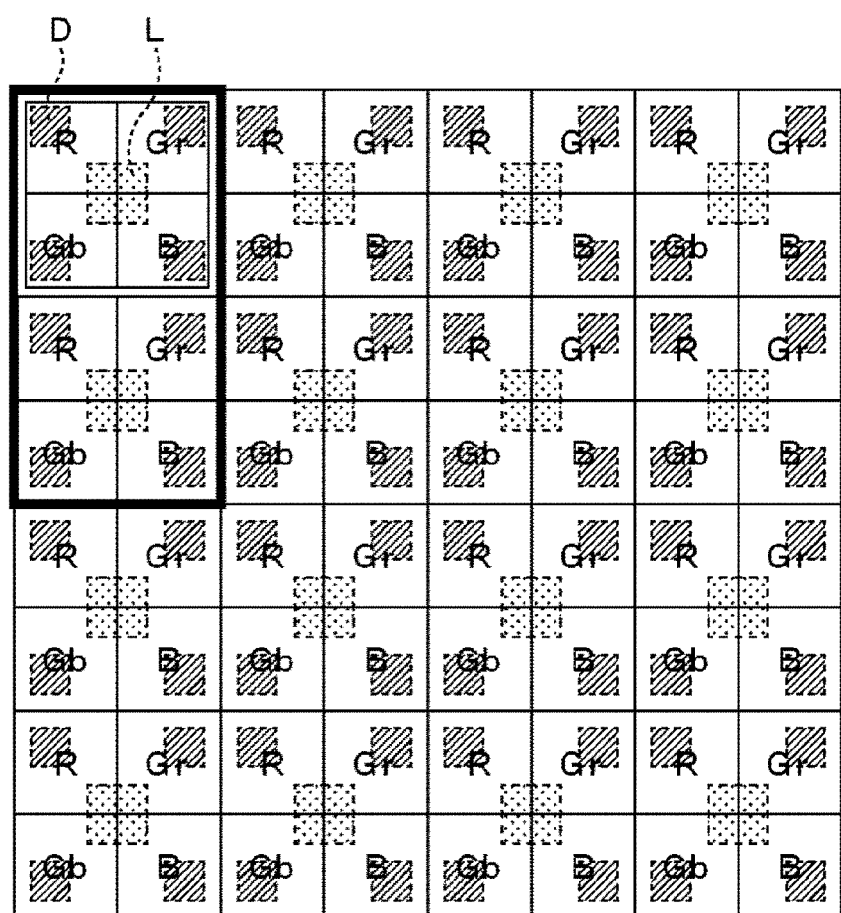
FIG. 9 is a diagram for explaining a configuration example according to a sixth embodiment of the solid-state image pickup element to which the present technology is applied.

FIG. 9 illustrates a configuration example of the solid-state image pickup element in which the disposition position of the real wire is configured with the same position in units of two pixels×two pixels sharing the same FD contact in addition to the dummy wire D corresponding to the dummy wires 35a and 36a in the wiring layers 35 and 36.

In more detail, in FIG. 9, a real wire L is disposed at the center position of two pixels×two pixels which is a unit for sharing the same FD contact, while the dummy wire D constituted by the dummy wires 35a and 36a is arranged at each corner portion of two pixels×two pixels which is a unit for sharing the FD contact.

With such a configuration, the real wire L having a square shape is disposed at the center position of two pixels×two pixels which is a unit for sharing the same FD contact, while the dummy wire D constituted by the dummy wires 35a and 36a having a square shape is arranged at each corner portion of two pixels×two pixels which is a unit for sharing the FD contact. This makes it possible to suppress characteristic fluctuations cause by capacitance fluctuations due to the dummy wire, while an affixing bonding strength of wafers is maintained, for a device configured by affixing a plurality of chips together to laminate.

Seventh Embodiment

The above description has used an example in which the real wire L is disposed at the center position of two pixels×two pixels which is a unit for sharing the FD contact, while the dummy wire D constituted by the dummy wires 35a and 36a is arranged at each corner portion of two pixels×two pixels which is a unit for sharing the FD contact. However, the dummy wire D and the real wire L are only required to be at the same position in units for sharing the FD contact.

Figure 10:
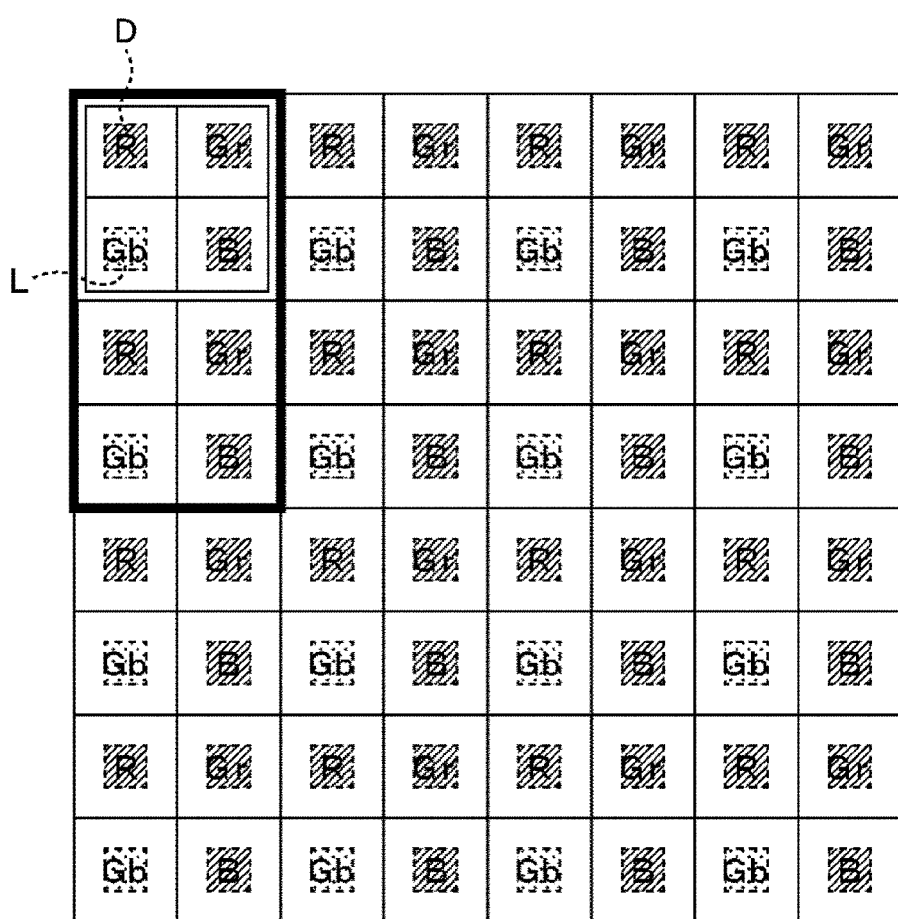
FIG. 10 is a diagram for explaining a configuration example according to a seventh embodiment of the solid-state image pickup element to which the present technology is applied.

FIG. 10 illustrates another configuration example when the dummy wire D and the real wire L are at the same position in units of two pixels×two pixels which is a unit for sharing the FD contact.

That is, in FIG. 10, the dummy wires D are disposed substantially at the center positions of specific three pixels (R, Gr, and B pixels in FIG. 10) of two pixels×two pixels which is a unit for sharing the same FD contact, while the real wire L is disposed substantially at the center position of the other one pixel (Gb pixel in FIG. 10).

That is, the dummy wire D and the real wire L that transmits the pixel signal from the wiring layer 35 to the wiring layer 36 are disposed in the same shape and at the same position at the same specific position using two pixels×two pixels as a unit, which is a unit for sharing the same FD contact. This makes it possible to suppress characteristic fluctuations cause by capacitance fluctuations due to the dummy wire, while an affixing bonding strength of wafers is maintained, for a device configured by affixing a plurality of chips together to laminate.

Note that the shape, arrangement, size, whether to use the fixed potential or floating in regard to the dummy wire D (the dummy wire 35a on the upper chip side and the dummy wire 36a on the lower chip side) and the real wire are not limited to the above-described embodiments but may be combined in various variations. Therefore, when variations of the first to seventh embodiments are summarized from the points thereof, for example, a combination of relationships as illustrated in FIG. 11 is obtained.

That is, the pitch of the dummy wire and the real wire may use any unit such as the FD contact, the sharing unit, or the pixel. In addition, the shape of the dummy wire and the real wire may be any shape including square (left), rectangle (left), octagon, square (cut off), rectangle (cut off), and stripe (vertical or horizontal). Here, "left" means forming the dummy wires and the real wires using a particular shape, whereas "cut off" means forming the dummy wires and the real wires using the shape of an outer circumferential portion obtained by cutting away a particular shape. Furthermore, as for the combination of the upper and lower chips, all upper and lower chips may be the same or different in shape, size, and position. In addition, the potential of the dummy wire may be floating or a fixed potential. Furthermore, regardless of an FD pixel pitch, a sharing unit pitch, or a pixel pitch, the presence or absence of the real wire is irrelevant.

<Technique for Reducing Influence of Characteristic Fluctuations>

By making the dummy wire 35a in the chip on the upper side larger than the dummy wire 36a in the chip on the lower side, the influence due to characteristic fluctuations can be decreased even if a shift arises when the wiring layers 35 and 36 are affixed on the bonding surface F.

Figure 12:
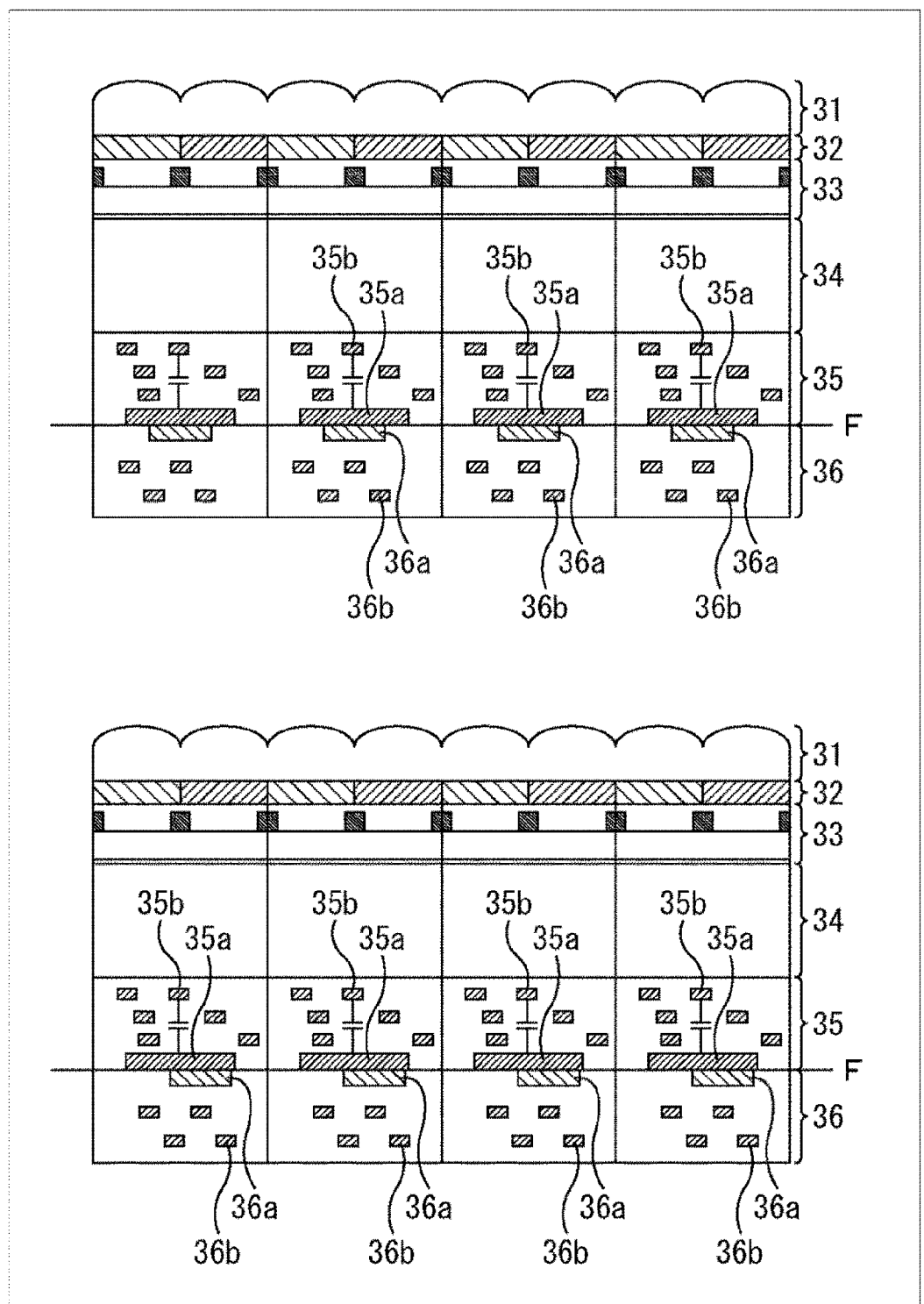
FIG. 12 is a diagram for explaining a technique for reducing the influence of characteristic fluctuations used by the solid-state image pickup element to which the present technology is applied.

That is, by making the dummy wire 35a larger than the dummy wire 36a in the chip on the lower side, even in a case where the dummy wires 35a and 36a are affixed together at a proper position as illustrated in the upper part of FIG. 12 and a case where the wiring layer 36 is shifted to the right with respect to the wiring layer 35 as illustrated in the lower part of FIG. 12, for example, the capacitance fluctuations generated by the coupling of the dummy wire 35a+the dummy wire 36a is substantially zero when seen from the dummy wire 35b. Accordingly, the influence thereof on the characteristic fluctuations can be practically reduced even if a shift arises at the time of affixing the wiring layers 35 and 36 together.

<Application to Device Other than Solid-State Image Pickup Element>

The above description has used an example of the solid-state image pickup element, but the present technology can be applied to another semiconductor device as long as the semiconductor device is configured by affixing chips together to laminate.

For example, the present technology can be applied to a case where a memory is configured by laminating a plurality of chips.

Figure 13:
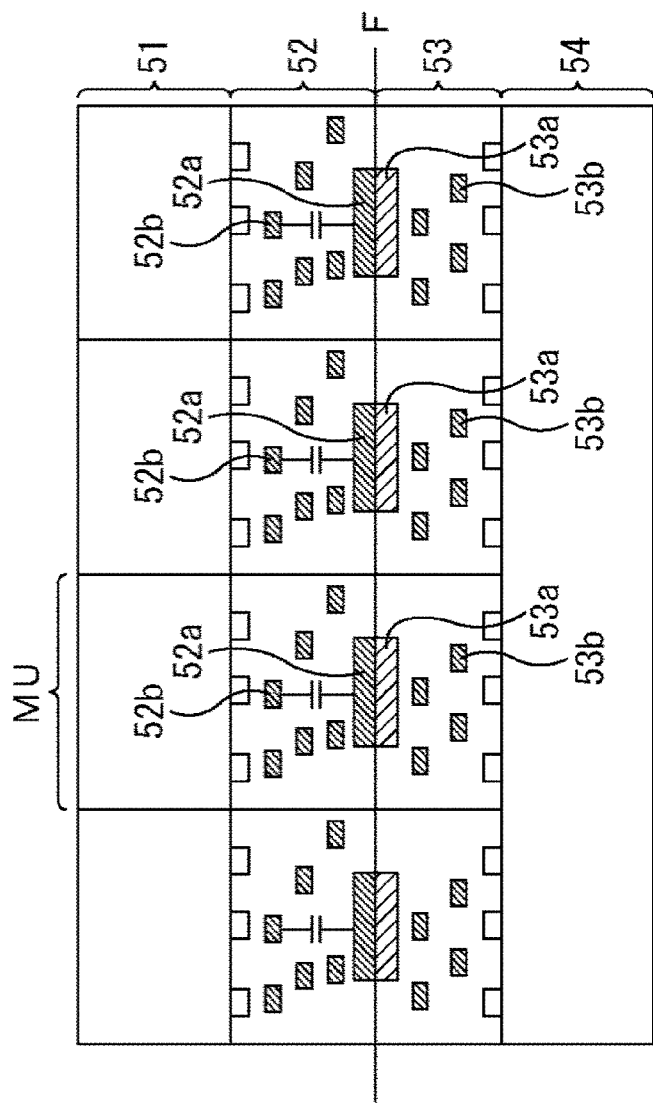
FIG. 13 is a diagram for explaining an application example of a semiconductor device to which the present technology is applied.

That is, as illustrated in FIG. 13, in a case where a memory is configured by affixing a chip constituted by a substrate layer 51 and a wiring layer 52 and a chip constituted by a wiring layer 53 and a substrate layer 54 together at the bonding surface F, it is possible to suppress characteristic fluctuations caused by capacitance fluctuations due to the dummy wire by arranging dummy wires 52a and 53a in line with a pitch for repeating the unit cell MU.

In this case, application to a memory is possible as long as the memory uses a unit cell and, specifically, the present technology can be applied to, for example, a dynamic random access memory (DRAM) and a flash memory. In addition to the memory, the present technology can be adapted to, for example, any semiconductor device as long as the semiconductor device is formed by repeatedly arranging unit cells.

<Example of Application to Electronic Apparatus>

The solid-state image pickup element described above can be applied to various electronic apparatuses, for example, an imaging device such as a digital still camera or a digital video camera, a mobile phone having an imaging function, or another apparatus having an imaging function.

Figure 14:
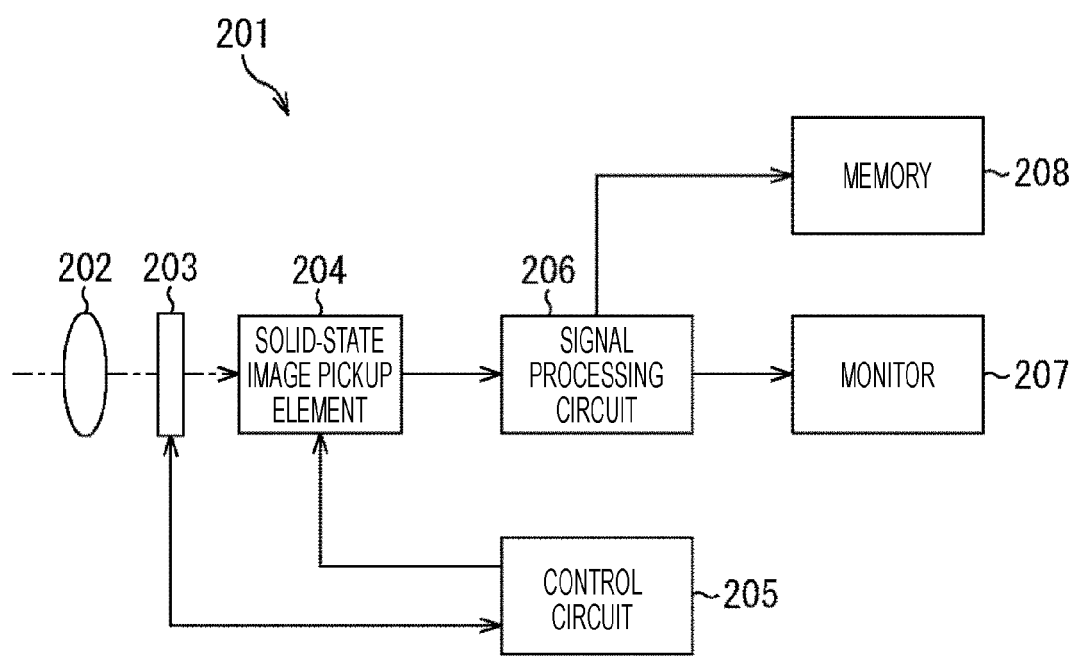
FIG. 14 is a diagram for explaining a configuration of an imaging device and an electronic apparatus using the solid-state image pickup element to which the present technology is applied.

FIG. 14 is a block diagram illustrating a configuration example of an imaging device serving as the electronic apparatus to which the present technology is applied.

The imaging device 201 illustrated in FIG. 14 is configured by including an optical system 202, a shutter device 203, a solid-state image pickup element 204, a drive circuit 205, a signal processing circuit 206, a monitor 207, and a memory 208, and capable of capturing a still image and a moving image.

The optical system 202 is configured by including one or a plurality of lenses and guides light (incident light) from a subject to the solid-state image pickup element 204 to form an image on a light receiving surface of the solid-state image pickup element 204.

The shutter device 203 is arranged between the optical system 202 and the solid-state image pickup element 204 and controls a light irradiation period and a light shielding period to the solid-state image pickup element 204 under the control of the drive circuit 1005.

The solid-state image pickup element 204 is constituted by a package including the above-described solid-state image pickup element. The solid-state image pickup element 204 accumulates a signal charge for a certain period according to light formed on the light receiving surface via the optical system 202 and the shutter device 203. The signal charges accumulated in the solid-state image pickup element 204 are transferred in accordance with a drive signal (timing signal) supplied from the drive circuit 205.

The drive circuit 205 outputs a drive signal for controlling a transfer action of the solid-state image pickup element 204 and a shutter action of the shutter device 203 to drive the solid-state image pickup element 204 and the shutter device 203.

The signal processing circuit 206 applies various types of signal processing to the signal charge output from the solid-state image pickup element 204. An image (image data) obtained through the signal processing applied by signal processing circuit 206 is supplied to the monitor 207 to be displayed or supplied to the memory 208 to be stored (recorded).

Also in the imaging device 201 configured as described above, it is possible to realize imaging with low noise at all pixels by applying the solid-state image pickup element 1 instead of the above-described solid-state image pickup element 204.

<Example of Use of Solid-State Image Pickup Element>

FIG. 15 is a diagram illustrating an example of use in which the above-described solid-state image pickup element is used.

For example, the above-described solid-state image pickup element can be used in various cases of sensing light such as visible light, infrared light, ultraviolet light, and X-ray, as described below.

- A device that captures an image to be used for viewing purposes, such as digital cameras or portable apparatuses with a camera function
- A device used for traffic purposes, such as in-vehicle sensors that capture images of the front, back, surroundings, inside, and so on of an automobile for, for example, safe driving such as automatic stop and recognition of the state by the driver, a surveillance camera that monitors traveling vehicles and roads, and a distance measuring sensor that measures a distance between vehicles, and so on
- A device used for home appliances such as TVs, refrigerators, and air conditioners to capture an image of a gesture of a user such that an apparatus is operated in accordance with the gesture
- A device used for medical and healthcare purposes, such as endoscopes and devices that perform angiography by receiving infrared light
- A device used for security purposes, such as surveillance cameras for crime prevention use and cameras for person authentication use
- A device used for cosmetic purposes, such as skin measuring instruments that capture images of skin and microscopes that capture images of the scalp
- A device used for sports purposes, such as action cameras and wearable cameras for sports use
- A device used for agricultural purposes, such as cameras for monitoring the condition of fields and crops Note that the present technology can be also configured as described below.

(1) A semiconductor device including two or more chips in which wires that are electrically connected are formed on bonding surfaces and the bonding surfaces opposing each other are bonded to be laminated, in which with respect to a region where the wires are periodically and repeatedly disposed in predetermined units, a dummy wire is disposed on the bonding surface at a pitch corresponding to the predetermined unit.

(2) The semiconductor device according to (1), in which the semiconductor device is a solid-state image pickup element, and with respect to a region where the wires are periodically and repeatedly disposed in predetermined units for a pixel of the solid-state image pickup element, the dummy wire is disposed on the bonding surface at a pitch corresponding to the predetermined unit.

(3) The semiconductor device according to (2), in which
the dummy wire disposed on one of the bonding surfaces opposing each other and the dummy wire disposed on another of the bonding surfaces opposing each other have substantially the same pattern.

(4) The semiconductor device according to (2), in which
the dummy wire disposed on one of the bonding surfaces opposing each other and the dummy wire disposed on another of the bonding surface opposing each other have different patterns.

(5) The semiconductor device according to any one of (2) to (4), in which
the predetermined unit for the pixel of the solid-state image pickup element is a plurality of the pixels sharing a contact of the same floating diffusion.

(6) The semiconductor device according to any one of (2) to (4), in which
the predetermined unit for the pixel of the solid-state image pickup element is a plurality of the pixels sharing the same floating diffusion.

(7) The semiconductor device according to (2) to (4), in which
the predetermined unit for the pixel of the solid-state image pickup element is a single one of the pixels.

(8) The semiconductor device according to any one of (2) to (7), in which
with respect to a region where the wires are periodically and repeatedly disposed in the predetermined units for the pixel of the solid-state image pickup element, a real wire is disposed along with the dummy wire on the bonding surface at a pitch corresponding to the predetermined unit.

(9) The semiconductor device according to any one of (1) to (7), further including an electrode to which a predetermined voltage is applied, in which
the dummy wire is fixed to the predetermined voltage applied from the electrode.

(10) A solid-state image pickup element including two or more chips in which wires that are electrically connected are formed on bonding surfaces and the bonding surfaces opposing each other are bonded to be laminated, in which
with respect to a region where the wires are periodically and repeatedly disposed in predetermined units for a pixel, the dummy wire is disposed on the bonding surface at a pitch corresponding to the predetermined unit.

(11) An imaging device including two or more chips in which wires that are electrically connected are formed on bonding surfaces and the bonding surfaces opposing each other are bonded to be laminated, in which
with respect to a region where the wires are periodically and repeatedly disposed in predetermined units for a pixel, the dummy wire is disposed on the bonding surface at a pitch corresponding to the predetermined unit.

(12) An electronic apparatus including two or more chips in which wires that are electrically connected are formed on bonding surfaces and the bonding surfaces opposing each other are bonded to be laminated, in which
with respect to a region where the wires are periodically and repeatedly disposed in predetermined units for a pixel, the dummy wire is disposed on the bonding surface at a pitch corresponding to the predetermined unit.

REFERENCE SIGNS LIST

11 Solid-state image pickup element
31 Lens layer
32 Color filter layer
33 Light shielding wall layer
33a Light shielding wall
34 Photoelectric change layer
35 Wiring layer
35a, 35b Dummy wire
36 Wiring layer
36a, 36b Dummy wire
51 Substrate layer
52 Wiring layer
52a, 52b Dummy wiring layer
53 Wiring layer
53a, 53b Dummy wiring layer
54 Substrate layer

What is claimed is:

1. A semiconductor device comprising two or more chips, wherein the semiconductor device is a solid-state image pickup element, wherein each chip includes a pixel region, wherein the pixel region of each chip includes a bonding surface, wherein electrically-connected wires are formed on the bonding surface of each chip, wherein opposing bonding surfaces are laminated to one another, wherein in a plan view, the electrically-connected wires are periodically and repeatedly disposed in a predetermined unit in the pixel region of each chip, and in the pixel region of each chip, a dummy wire is disposed on the bonding surface at a pitch corresponding to the predetermined unit, wherein a first dummy wire disposed on a first bonding surface of a first chip of the semiconductor device couples to a second dummy wire disposed on a second bonding surface of a second chip of the semiconductor device, wherein the first bonding surface of the first chip is laminated to the second bonding surface of the second chip, and wherein the first dummy wire and the second dummy wire are disposed to correspond to at least a center part of the predetermined unit.

2. The semiconductor device according to claim 1, wherein the semiconductor device includes a light receiving element.

3. The semiconductor device according to claim 2, wherein
the first bonding surface opposes the second bonding surface, and
a pattern of the first dummy wire disposed on the first bonding surface is substantially identical to a pattern of the second dummy wire disposed on the second bonding surface.

4. The semiconductor device according to claim 2, wherein
the first bonding surface opposes the second bonding surface, and
a pattern of the first dummy wire disposed on the first bonding surface is different from a pattern of the second dummy wire disposed on the second bonding surface.

5. The semiconductor device according to claim 2, wherein
a plurality of pixels share a contact of a floating diffusion.

6. The semiconductor device according to claim 2, wherein
a plurality of pixels share a floating diffusion.

7. The semiconductor device according to claim 2, wherein
the predetermined unit of each chip is a unit for a pixel of each chip.

8. The semiconductor device according to claim 7, wherein the first dummy wire and the second dummy wire are disposed to correspond to a floating diffusion of the unit for the pixel of each chip.

9. The semiconductor device according to claim 8, wherein the floating diffusion is shared by the unit for the pixel of each chip.

10. The semiconductor device according to claim 2, wherein
a real wire is disposed on the bonding surface of each chip with the dummy wire of each chip at the pitch corresponding to the predetermined unit, wherein the real wire transmits a pixel signal.

11. The semiconductor device according to claim 1, further comprising an electrode to which a predetermined voltage is applied, wherein
the dummy wire of each chip is fixed to the predetermined voltage, wherein the predetermined voltage is applied to the dummy wire from the electrode.

12. A solid-state image pickup element comprising two or more chips, wherein each chip includes a pixel region, wherein the pixel region of each chip includes a bonding surface, wherein electrically-connected wires are formed on the bonding surface of each chip, wherein opposing bonding surfaces are laminated to one another, wherein in a plan view, the electrically-connected wires are periodically and repeatedly disposed in a predetermined unit in the pixel region of each chip, and in the pixel region of each chip, a dummy wire is disposed on the bonding surface at a pitch corresponding to the predetermined unit, wherein a first dummy wire disposed on a first bonding surface of a first chip of the semiconductor device couples to a second dummy wire disposed on a second bonding surface of a second chip of the semiconductor device, wherein the first bonding surface of the first chip is laminated to the second bonding surface of the second chip, and wherein the first dummy wire and the second dummy wire are disposed to correspond to at least a center part of the predetermined unit.

13. An imaging device comprising two or more chips, wherein the imaging device is a solid-state image pickup element, wherein each chip includes a pixel region, wherein the pixel region of each chip includes a bonding surface, wherein electrically-connected wires are formed on the bonding surface of each chip, wherein opposing bonding surfaces are laminated to one another, wherein in a plan view, the electrically-connected wires are periodically and repeatedly disposed in a predetermined unit in the pixel region of each chip, and in the pixel region of each chip, a dummy wire is disposed on the bonding surface at a pitch corresponding to the predetermined unit, wherein a first dummy wire disposed on a first bonding surface of a first chip of the semiconductor device couples to a second dummy wire disposed on a second bonding surface of a second chip of the semiconductor device, wherein the first bonding surface of the first chip is laminated to the second bonding surface of the second chip, and wherein the first dummy wire and the second dummy wire are disposed to correspond to at least a center part of the predetermined unit.

14. An electronic apparatus comprising two or more chips, wherein the electronic apparatus is a solid-state image pickup element, wherein each chip includes a pixel region, wherein the pixel region of each chip includes a bonding surface, wherein electrically-connected wires are formed on the bonding surface of each chip, wherein opposing bonding surfaces are laminated to one another, wherein in a plan view, the electrically-connected wires are periodically and repeatedly disposed in a predetermined unit in the pixel region of each chip, and in the pixel region of each chip, a dummy wire is disposed on the bonding surface at a pitch corresponding to the predetermined unit, wherein a first dummy wire disposed on a first bonding surface of a first chip of the semiconductor device couples to a second dummy wire disposed on a second bonding surface of a second chip of the semiconductor device, wherein the first bonding surface of the first chip is laminated to the second bonding surface of the second chip, and wherein the first dummy wire and the second dummy wire are disposed to correspond to at least a center part of the predetermined unit.

\* \* \* \* \*